(12) United States Patent
Pajkic et al.

(10) Patent No.: US 12,095,229 B2
(45) Date of Patent: Sep. 17, 2024

(54) LIGHT EMITTER UNIT HAVING AT LEAST ONE VCSEL CHIP

(71) Applicant: OSRAM Opto Semiconductors GmbH, Regensburg (DE)

(72) Inventors: Zeljko Pajkic, Regensburg (DE); Florian Nuetzel, Kirchheim (DE); Fabian Knorr, Postbauer-Heng (DE); Michael Mueller, Garching (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 631 days.

(21) Appl. No.: 17/295,819

(22) PCT Filed: Nov. 20, 2019

(86) PCT No.: PCT/EP2019/081905
§ 371 (c)(1),
(2) Date: May 20, 2021

(87) PCT Pub. No.: WO2020/104514
PCT Pub. Date: May 28, 2020

(65) Prior Publication Data
US 2022/0029386 A1  Jan. 27, 2022

(30) Foreign Application Priority Data
Nov. 23, 2018  (DE) ...................... 10 2018 129 575.8

(51) Int. Cl.
*H01S 5/183* (2006.01)
*H01S 5/02234* (2021.01)
*H01S 5/02253* (2021.01)

(52) U.S. Cl.
CPC .......... *H01S 5/183* (2013.01); *H01S 5/02234* (2021.01); *H01S 5/02253* (2021.01)

(58) Field of Classification Search
CPC .. H01S 5/183; H01S 5/02234; H01S 5/02253; H01S 5/02325; H01S 5/0234;
(Continued)

(56) References Cited

U.S. PATENT DOCUMENTS 5,939,773 A  8/1999  Jiang et al.
5,974,066 A  10/1999  Wu et al.
(Continued)

FOREIGN PATENT DOCUMENTS

DE  10048433 A1  4/2001
DE  10053569 A1  5/2001
(Continued)

OTHER PUBLICATIONS

Margalit et al., "Vertical Cavity Lasers for Telecom Applications", IEEE Communications Magazine, May 1997, pp. 164-170.
(Continued)

*Primary Examiner* — Vu A Vu
(74) *Attorney, Agent, or Firm* — MH2 TECHNOLOGY LAW GROUP LLP

(57) ABSTRACT

The invention relates to a light emitter unit having at least one VCSEL chip, which light emitter unit comprises: a light exit surface, via which light produced by the VCSEL chip and radiated perpendicularly to the chip plane is emitted into the surroundings; and contacts for supplying the electrical energy required for the production of the light by the VCSEL chip. The described technical solution is characterized in that at least one lateral surface of the VCSEL chip arranged perpendicularly to the chip plane is touched and covered, at least in parts, by a cover element.

15 Claims, 3 Drawing Sheets

(58) Field of Classification Search
CPC ............. H01S 5/02208; H01S 5/02257; H01S 5/18305; H01S 5/423; H01S 2301/176
USPC .................................................. 372/50.124
See application file for complete search history.

(56) References Cited

U.S. PATENT DOCUMENTS

| | | | |
|---|---|---|---|
| 6,051,848 A | 4/2000 | Webb | |
| 6,670,599 B2* | 12/2003 | Wagner | H01L 31/12 438/141 |
| 7,838,357 B2* | 11/2010 | Bogner | H01L 33/60 438/200 |
| 8,313,962 B2* | 11/2012 | Lott | H01L 33/48 257/E31.127 |
| 8,976,833 B2* | 3/2015 | Lai | H01S 5/02253 372/50.23 |
| 9,000,474 B2* | 4/2015 | Muramatsu | H05K 1/0201 257/676 |
| 9,041,015 B2* | 5/2015 | Lai | G02B 6/12004 257/81 |
| 9,159,712 B2* | 10/2015 | Ootorii | H01L 25/167 |
| 9,190,810 B2* | 11/2015 | Su | H01S 5/18302 |
| 9,368,435 B2* | 6/2016 | Otremba | H01L 23/49562 |
| 9,478,939 B2* | 10/2016 | Lai | H01S 5/02251 |
| 9,660,147 B2* | 5/2017 | Jagt | H01L 33/60 |
| 2003/0160258 A1 | 8/2003 | Oohata | |
| 2003/0179800 A1 | 9/2003 | Uebbing | |
| 2004/0184495 A1 | 9/2004 | Kondo | |
| 2005/0186763 A1 | 8/2005 | Oohata | |
| 2005/0224936 A1* | 10/2005 | Wu | H01L 23/3128 257/678 |
| 2006/0120660 A1 | 6/2006 | Rolston et al. | |
| 2009/0207875 A1 | 8/2009 | Nagasaka | |
| 2012/0248977 A1 | 10/2012 | Ootorii | |
| 2013/0092850 A1 | 4/2013 | Ootorii | |
| 2013/0330090 A1 | 12/2013 | Obika et al. | |
| 2014/0269804 A1 | 9/2014 | Lai et al. | |
| 2016/0245998 A1 | 8/2016 | Lai et al. | |

FOREIGN PATENT DOCUMENTS

| | | |
|---|---|---|
| DE | 69428578 T2 | 6/2002 |
| DE | 102005007668 A1 | 11/2005 |
| DE | 102010024862 A1 | 12/2011 |
| DE | 102014101818 A1 | 8/2014 |
| EP | 0658933 A2 | 12/1994 |
| WO | 2012156514 A1 | 11/2012 |
| WO | 2016102474 A1 | 6/2016 |
| WO | 2018147963 A1 | 8/2018 |

OTHER PUBLICATIONS

International Search Report (with English translation) and Written Opinion mailed on Feb. 21, 2020 for corresponding International Application No. PCT/EP2019/081905 (Examiner, Unknown), 13 pages.

* cited by examiner

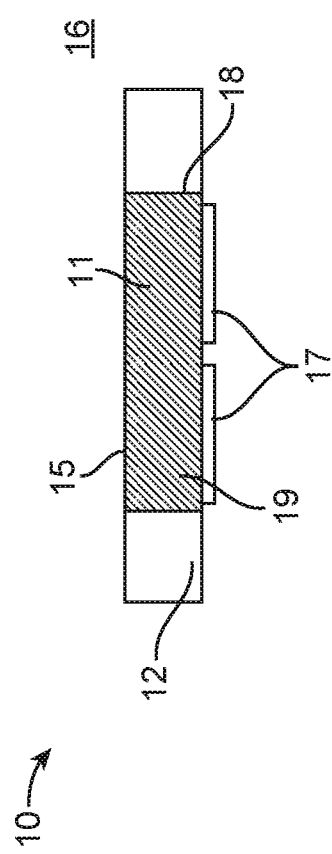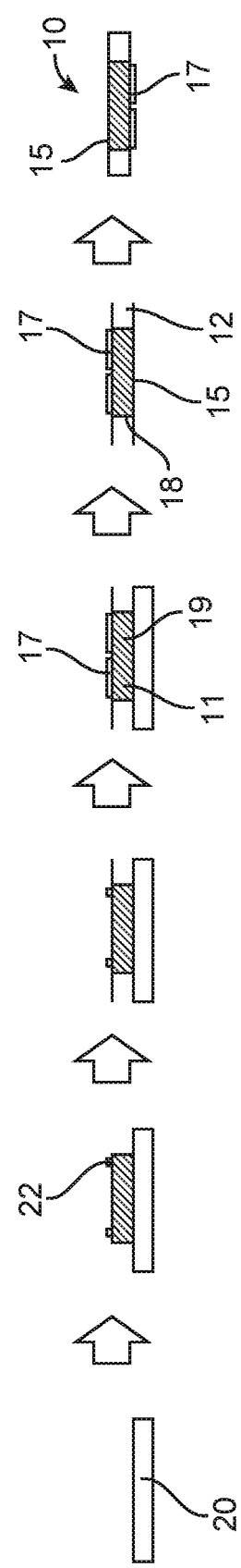

LIGHT EMITTER UNIT HAVING AT LEAST ONE VCSEL CHIP

CROSS-REFERENCE TO RELATED APPLICATIONS

The present application is a national stage entry from International Application No. PCT/EP2019/081905, filed on Nov. 20, 2019, published as International Publication No. WO 2020/104514 A1 on May 28, 2020, and claims priority to German application 102018129575.8 filed Nov. 23, 2018, the contents of all which are incorporated by reference herein.

FIELD

The present invention relates to a light emitter unit comprising a VCSEL chip which, on the one hand, has a light emission surface via which light generated by the VCSEL chip and emitted perpendicularly to the chip plane is emitted into an environment and, on the other hand, has contacts for supplying the electrical energy required for the generation of the light by the VCSEL chip.

BACKGROUND

Vertical cavity surface emitting lasers, so-called VCSELs (vertical cavity surface emitting lasers), are known for example from IEEE Communications Magazine, May 1997, pp. 164-170. VCSELs are semiconductor lasers with light emission perpendicular to the semiconductor surface. Besides their extremely small size and high efficiency, VCSELs are characterized by their very good beam properties. VCSELs, which are available as chips and also in different package versions, can be used in a variety of applications. In sensor technology as well as in measurement technology, a typical field of application is fiber-optic data transmission. In general, VCSELs are used in data transmission, in memory networks, barcode and laser scanners, laser printers, optical encoders, position sensors, systems for distance measurement, as digital video interface and in medical technology, especially in systems for blood analysis.

As a rule, VCSELs operate with light modulation, are characterized by a highly focused laser beam, support a high data rate and require a relatively low drive current. VCSELs are therefore developed especially for hi-speed transmission and typically emit light with a wavelength of 665 nm. However, they are also available for optical windows at 850 nm, 1310 nm and 1550 nm and can be used at data rates between 1 Gbit/s and 50 Gbit/s. Furthermore, VCSELs feature extremely low beam divergence compared to edge-emitting lasers (EELs) and enable simple fiber coupling, where the laser beam does not fill the entire core glass of the optical waveguide.

A corresponding VCSEL is known from DE 100 48 443 A1. This document describes a VCSEL with a semiconductor body and a first and a second main surface, wherein a first contact surface is formed on the first main surface and a second contact surface is formed on the second main surface. Further provided is an active layer disposed between a first mirror and a second mirror. The generated radiation is coupled out through the second mirror and the second main surface, wherein the second contact surface formed thereon is arranged downstream of the second mirror and is transparent or at least semitransparent for the generated radiation.

Furthermore, from DE 100 53 569 A1 a device for coupling the optical energy from a headpiece with arranged and ready-to-use VCSEL into a waveguide arranged within a fiber optic sleeve, a housing or a receptacle is known. The technical solution described is characterized by the fact that the coupling ring has a central opening in which a spherical lens is held. In addition, a cylindrical sidewall is configured such that the coupling ring fits over a window cover of a typical headpiece to position the lens precisely on the optical axis of the VCSEL.

Furthermore, a method for manufacturing a VCSEL is known from DE 10 2005 007 668 A1. The manufacturing process described is intended in particular to provide an improved semiconductor structure with the aid of etched oxide sidewalls.

VCSELs, which are usually used in quite different devices due to the various fields of application, are assembled into relatively large packages, which ultimately limits the technical design of the devices in which the VCSELs are installed. The comparatively large package size of the known VCSELs is due to the fact that VCSELs are arranged on a substrate, for example PCB, or a ceramic, and are assembled with a fixed package and, depending on the intended use, with one or more optical elements. Furthermore, in the known VCSEL chips, the contacts are located on the underside, which in turn has an influence on the design of the end products.

Based on the light emitters with VCSEL chips known from the prior art and the problems described above, the invention is based on the task of specifying a corresponding light emitter unit which, on the one hand, enables simple, fast and inexpensive production and, on the other hand, has comparatively small dimensions. The technical solution to be specified should also make it possible to use generally known manufacturing processes for the production of the novel light emitter with VCSEL chip. Furthermore, a light emitter unit comprising at least one VCSEL chip should be designed in such a way that it can be flexibly adapted to different designs of products in which the device is to be incorporated. In particular, it should thus be possible to flexibly adapt a light emitter unit with a VCSEL chip to different requirements so that comparatively simple integration into devices with different designs and available installation space is possible.

SUMMARY

The aforementioned task is solved with a light emitter unit with at least one VCSEL chip according to claim 1. Advantageous embodiments of the invention are the subject of the dependent claims and are explained in more detail in the following description with partial reference to the figures.

The invention relates to a light emitter unit having at least one VCSEL chip, which on the one hand has a light emission surface via which light generated by the VCSEL chip and emitted perpendicularly to the chip plane is emitted into an environment, and which on the other hand has contacts for supplying the electrical energy required for the generation of the light by the VCSEL chip. According to the invention, this device has been further designed in such a way that at least one side surface of the VCSEL chip arranged perpendicular to the chip plane is touched and covered at least in sections by a cover element. The cover element closes substantially planar with the light emission surface. It is expressly pointed out that the light emitter unit can have one or a plurality of VCSEL chips, preferably arranged in an array, it also being generally conceivable that a plurality of VCSELs are arranged on a semiconductor wafer, preferably in the form of an array. Incidentally, it is just as conceivable that a plurality of light emitter units implemented according to the invention are arranged in the form of an array.

It is essential to the invention that at least the at least one VCSEL chip is directly surrounded by a cover element at least in certain areas, so that the cover element touches the outer edge of the VCSEL chip. A particularly suitable connection between the at least one side surface of the VCSEL chip and the cover can be produced if the cover element is at least temporarily liquid or at least pasty during the production of the light emitter unit. Due to the cover element provided according to the invention adjacent to the edge of the VCSEL chip, preferably to the edge of the light emitter unit, a particularly space-saving design of an edge-encapsulated VCSEL chip and/or a light emitter unit with such a chip is made possible.

According to a special further development, all four side surfaces of the at least one VCSEL chip are surrounded by the cover element, wherein the cover element is preferably made of a material that is flexible at least within certain limits. In this context, it is conceivable that the cover element provided according to the invention has been manufactured by casting a suitable material and/or by an injection molding process, for example film-assisted transfer molding (FAM), compression molding or transfer molding.

The invention is based on the essential idea of using the Chip Sized Packaging (CSP) processes known from the production of LEDs also for the production of light emitter units with VCSEL chip. With the help of the known CSP processes and taking into account the technical features of a VCSEL, it is thus possible to provide compact and powerful light emitters with a VCSEL chip that can be integrated into the respective end products in a comparatively simple, flexible and advantageous manner. By dispensing with a rigid structure, which in known technical solutions is formed by a substrate and a fixed package, the space required for integrating a light emitter unit with VCSEL chip is reduced on the one hand, and on the other hand such light emitters can be used comparatively easily in end products with very different designs or at least adapted taking into account the respective requirements.

On the basis of the invention, a miniaturization of a light emitter unit with VCSEL chip is thus achieved, so that both technical advantages and additional flexibility are achieved with regard to possible use. Furthermore, since a smaller amount of material and fewer process steps are required for the manufacture of a light emitter unit with VCSEL chip according to the invention, not inconsiderable cost savings can be realized compared to the known solutions.

Due to the possibility of using one of the previously mentioned manufacturing processes, a particular embodiment of the invention provides that the cover element has at least one material from a material group comprising silicone, epoxy resin and a composite material. Moreover, it is conceivable that the material used for the cover element comprises at least one filler which leads to the improvement of at least one property of the material. Such a filler may, for example, be silicon dioxide (SiO2). In this context, an epoxy resin to which silicon dioxide (SiO2) has been added is particularly suitable as a material for the production of a cover element.

In a special further development, the VCSEL chip of the light emitter unit is arranged on an integrated circuit (IC). Preferably, the integrated circuit contains the control electronics for driving the VCSEL. In an advantageous manner, the driver or the driver logic for the VCSEL chip is also integrated into the integrated control. By such an arrangement the switching times for the control of the VCSEL chip can be kept particularly short. In addition, parasitic lead inductances are minimized, especially when more than one VCSEL chip is controlled.

In a special embodiment, the light emission surface of the light emitter unit is part of the VCSEL chip, which in this case emits the generated light directly into the environment. According to an alternative embodiment of the light emitter unit according to the invention, at least one optical element is provided which at least partially forms the light emission surface. In general, it is conceivable that the optical element is a simple protective element that is transparent to the light emitted by the VCSEL chip and/or, in particular, a suitable, appropriately designed window.

According to a further embodiment, it is provided that an optical element is selected that is suitable for beam guidance. In this context, it is conceivable that the optical element comprises at least one diffractive optical element, a meta-optic and/or a lens, preferably a microlens. It is of particular advantage if the optical element is selected such that the light emitter unit with VCSEL is designed as a Lambertian radiator. A light emitter unit designed in this way is characterized by the fact that the radiance is constant over the light emission surface and thus a circular distribution of the radiance results.

In another embodiment, an optical spacer is arranged between the VCSEL chip of the light emitter unit and the light emission surface. This spacer has the function of coupling the light emitted by the VCSEL chip to the light exit surface as loss-free as possible and taking into account the refraction occurring at surface boundaries. According to a very particular embodiment, the optical spacer is located between the VCSEL chip and an optical element having the light emitting surface, so that the optical spacer couples the light emitted by the VCSEL chip into the optical element. Preferably, the optical spacer has a coupling medium that suitably compensates for the differences in refractive indices between the VCSEL chip and the optical element.

According to a further embodiment, it is provided that the VCSEL chip has at least one integrated circuit. The provision of an integrated circuit in the VCSEL chip first of all has the advantage of a further space saving, in particular in the case of a planar design of the VCSEL chip with integrated circuit.

Preferably, the at least one integrated circuit of the VCSEL chip has the controller and driver for driving the VCSEL chip. Furthermore, integrated controls that are closely arranged on or in the VCSEL chip not only offer the advantage of short switching times, but also of reducing parasitic lead inductances. Furthermore, compact circuits simplify the layout of a light emitter unit designed according to the invention and the heat dissipation can be optimally implemented.

According to another special further development of the invention, it is provided that at least one sensor and/or detector is integrated into the VCSEL chip. In this context, it is conceivable, for example, that at least one light-sensitive detector is integrated into the VCSEL chip of the light emitter unit, which detector receives radiation caused by reflection of the light emitted by the device from at least one object. On the basis of the detection of the received radiation, in particular reflected at an object, distance measurements or measurements relating to the shape of an object, for example, can be carried out with the aid of a suitable evaluation unit. Particularly advantageously, a light emitter unit with a VCSEL chip can perform such measurements, provided that an array of VCSEL chips and/or a plurality of light-sensitive detectors are provided.

In a particular embodiment of the invention, a plurality of the previously described light emitter unit with VCSEL chip is interconnected in an array. Likewise, it is conceivable that a light emitter unit has a plurality of VCSEL chips, which may also be arranged on a common semiconductor wafer. Such a plurality of VCSEL chips can be used in an advantageous manner for distance measurement and/or for detecting the shape and/or form of objects. In this case, the VCSEL chips emit light of a suitable wavelength that is reflected by objects located in the environment. The reflected radiation is finally recorded with the aid of suitable detectors and evaluated in such a way that, depending on the requirement, information about the distance of the object and/or the shape and form of the object can be provided.

It is essential for the technical solution according to the invention that a light emitter unit with a VCSEL chip does not have a fixed substrate and a rigid housing, but that the VCSEL chip and, if required, further components of the light emitter unit are encapsulated or injection-molded at least in an edge region with a suitable material, for example epoxy resin provided with a filler. Various processes are known for achieving such a package-free encapsulation of the VCSEL chip, with other optical components of a light emitter unit with VCSEL chip also being encapsulated, if necessary, at least in the edge region. The processes in question include, for example, transfer molding, compression molding and film-assisted transfer molding. In general, it is also conceivable to encapsulate the VCSEL chip and, if required, the other electronic and/or optical elements of the light emitter unit with a suitable encapsulation material, such as silicone, epoxy resin or a composite, in each case with or without special fillers. With the aid of the aforementioned processes, a light emitter unit with VCSEL chip can be provided whose optical components, namely the VCSEL chip with or without further optical components or circuits, are surrounded in a suitable manner with a cured encapsulation material. Here, the encapsulation of a device designed according to the invention is realized in such a way that the beam propagation of the light generated by the VCSEL chip perpendicular to the chip plane, i.e. to the plane of the semiconductor wafer with VCSEL, is not impeded.

BRIEF DESCRIPTION OF THE DRAWINGS

In the following, without limiting the general idea of the invention, the invention will be explained in more detail by means of specific embodiments and with reference to the figures. Thereby show:

FIG. 5: Light emitter unit with a bottom emitting VCSEL chip package with metallized contacts and FIG. 6: Method of manufacturing a light emitter unit with a bottom-emitting VCSEL chip with metallized contacts.

DETAILED DESCRIPTION

Figure 1:
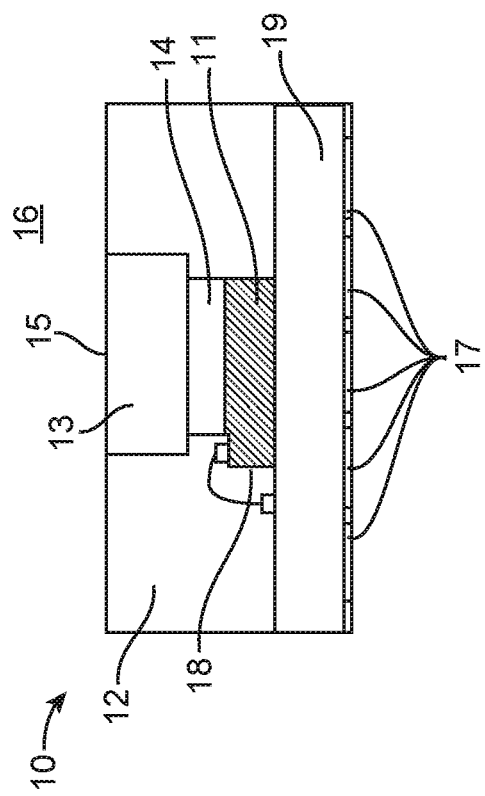
FIG. 1: Light emitter unit with a VCSEL chip on an integrated circuit with optical spacer and optical element.

FIG. 1 shows a sectional view of a light emitter unit 10 with a VCSEL chip 11. An essential feature of the device 10 shown is that the VCSEL chip 11 is not arranged on a solid substrate and no corresponding solid housing is provided. Rather, a cover element 12 surrounding the VCSEL chip 11 is provided, which has been manufactured by way of film-assisted transfer molding (FMA). In principle, it is conceivable to use other processes, in particular compression molding, to manufacture a corresponding cover element 12. In this case, the cover element 12 has an epoxy resin filled with silicon dioxide ($SiO_2$).

The VCSEL chip 11 is located on an integrated circuit (IC) 19, on the underside of which electrical contacts 17 are provided for contacting and supplying the VCSEL chip and the integrated circuit 19, in which the control of the VCSEL chip 11 is implemented, with the electrical energy required for light generation. The integrated circuit 19 contains the control electronics for driving the VCSEL chip 11 as well as the driver control. By such an arrangement of the integrated circuit 19 in the immediate vicinity of the VCSEL chip 11, particularly low switching times can be achieved and parasitic lead inductances can be reduced in an advantageous manner.

According to the embodiment shown in FIG. 1, the light emitter unit 1 further has an optical element 13, which in this case is designed in such a way that the light emitter unit 10 is designed as a Lambertian radiator. Alternatively, it is conceivable to design the optical element 13 in such a way that the radiation emitted into the environment 16 is particularly homogeneous along its propagation direction. Furthermore, an optical spacer 14 is provided between the VCSEL chip 11 and the optical element 13, which does not assume any optical function, i.e. in particular no beam steering. Rather, the optical spacer 14 serves to couple the light generated by the VCSEL chip 11 into the optical element 13, whereby negative effects due to refraction effects at the transition between individual elements are at least minimized.

Since the light emitter unit 10 shown in FIG. 1 has preferably been molded or encapsulated using film-assisted transfer molding (FAM), the package shown has a comparatively small design compared to the known conventional solutions with VCSEL chips. In particular, the height of the light emitter unit shown is considerably smaller compared to known technical solutions.

Figure 2:
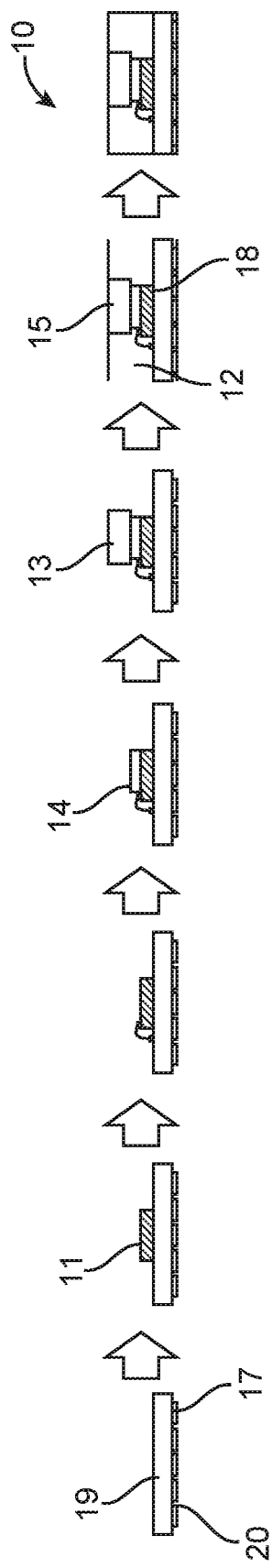
FIG. 2: Method of manufacturing a light emitter unit with EL chip on an integrated circuit with optical spacer and optical element.

FIG. 2 shows a method for manufacturing a light emitter unit with VCSEL chip on an integrated circuit with optical spacer and optical element. The method shown in FIG. 2 is used to manufacture a device as shown in FIG. 1.

To manufacture the device shown in FIG. 1, a temporary carrier 20 is first equipped with chips containing integrated circuits 19. Then, the VCSEL chip is applied to the temporary carrier 20 on the side opposite the chips with integrated circuits 19 by die bonding, preferably by micro welding. Subsequently, wire bonding of the chips with integrated circuits 19 provided on the underside of the temporary carrier 20 is carried out.

In an alternative embodiment, it is conceivable in this context that a connection between the integrated circuits 19, i.e., the IC chips, and the VCSEL chip 11 is made by first making the VCSEL chip 11 and then applying the integrated circuits 19 together with the driver logic to the VCSEL chip 11 using a grow process.

Finally, after wire bonding is completed, first the optical spacer 13 is applied to the VCSEL chip 11 and then the optical element 14 is applied to the optical spacer 13 in two successive process steps. After completion of this assembly, film-assisted transfer molding (FAM) is performed, whereby the components arranged on the temporary carrier 20 are surrounded by a filled epoxy resin on their side surfaces 18. This process is performed in such a way that the light emitting surface 15 of the light emitter unit 10 is not encapsulated, and light generated by the VCSEL chip 11 can be emitted unobstructed through the optical spacer 14 and the optical element 13 via the light emitting surface 15 into the environment 16.

In film-assisted transfer molding (FAM), an almost pressureless production of a cover element 12 in the edge region of the light emitter unit 10 takes place with the aid of an epoxy-containing molding compound, which effects a suitable encapsulation of the light emitter 10 shown. As shown in the figure, the molding compound has a height such that it is flush with the light-emitting surface 15. As a result, the light emitting surface 15 and the top surface of the cover element 12 form a substantially planar surface. The light emitted by the VCSEL chip does not have to pass through the cover element.

In contrast to transfer molding, in film-assisted transfer molding (FAM) both mold parts are each covered with a thin ETFE film to prevent direct contact between the thermoplastic and the mold. The advantages of the process allow simplified and more cost-effective mold construction.

In film-assisted transfer molding, PTFE films are fed along both sides of the device to be encapsulated, which are adapted to the shape of the mold with the aid of a vacuum. An epoxy resin material (EMC—Epoxy Molding Compound) is introduced into the cavities between the films and the component to be encapsulated. At the same time, heating elements are provided to heat the device to a temperature of 170 to 185° C.

After completion of the film-assisted transfer molding, the light emitter units 10 encapsulated together at their side surfaces 18 with a cover element 12 are first separated or singled from each other.

Figure 3:
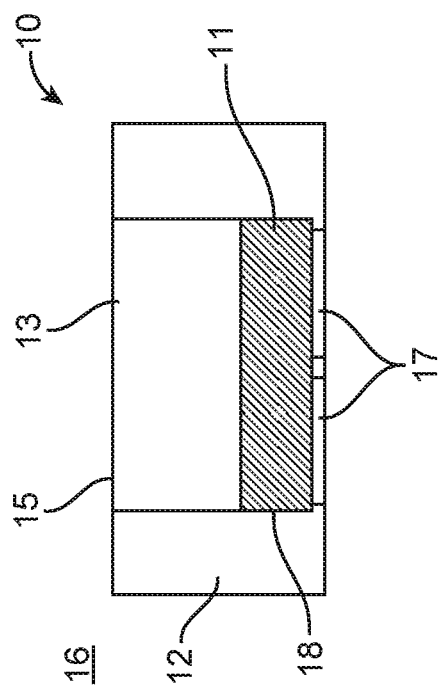
FIG. 3: Light emitter unit with substrate-less VCSEL chip and optical element.

FIG. 3 shows a light emitter unit with a VCSEL chip without a substrate with an optical element, where the VCSEL chip was contacted using a flip-chip assembly.

The light emitter unit shown in FIG. 3 has a VCSEL chip on which an optical element 13 for beam guidance is located.

Opposite the optical element 13 on the underside of the VCSEL chip are the electrical contacts 17 of the light emitter unit. A cover element 12 is again provided on the side surfaces of the VCSEL chip 11 and the optical element 13, which in this case is designed as a cured potting material.

With the aid of the cured encapsulation material, a substrate- and housing-free encapsulation of the light emitter unit 10 with VCSEL chip 11 is thus again provided, which enables a particularly space-saving design of the device 10. In particular, the height of the device 10 is significantly lower compared to known technical solutions.

In the following, it will be explained in more detail how the VCSEL chip was contacted with the help of the flip chip assembly. A key feature of flip-chip mounting is that the chip, in this case the VCSEL chip, is mounted with the active contact side facing downwards without any further connecting wires. This technology again allows comparatively small dimensions and short conductor lengths to be realized.

Figure 4:
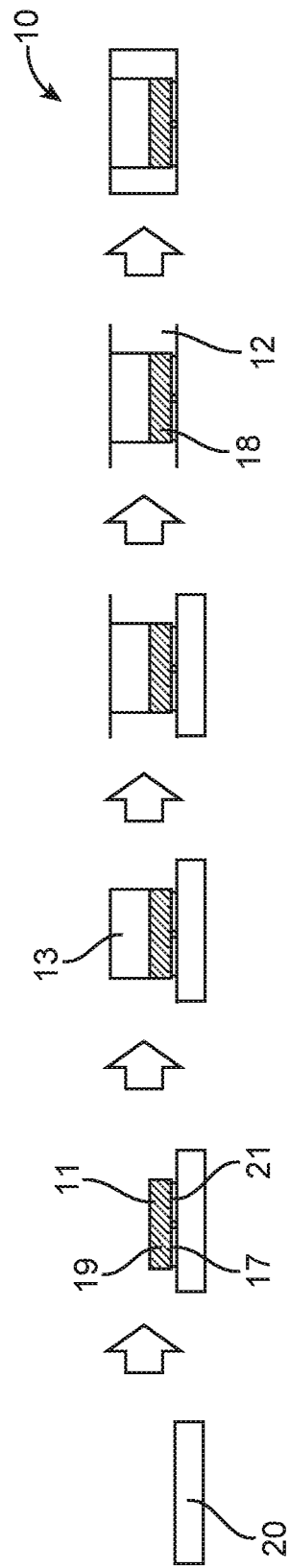
FIG. 4: Method of manufacturing a light emitter unit with substrate-less VCSEL chip and optical element.

FIG. 4 now shows the individual process steps in the manufacture of the light emitter unit 10 with VCSEL chip 11 and optical element 13 shown in FIG. 3. In a first step, a temporary carrier 20 is equipped with a VCSEL chip 11, which is applied to the temporary carrier 20 with its contact surface 21 facing downwards. In a next step, the optical element 13, which serves to guide the beam of radiation generated and emitted by the VCSEL chip 11, is applied to the VCSEL chip 11. Then, the device or a plurality of devices consisting of temporary carrier 20, VCSEL chip 11, contacts 17 and optical element 13 are provided with a covering element 12 on its side surfaces 18 by potting.

The temporary carrier 20 is then removed, preferably by a chemical process or laser ablation, and finally the individual light emitter units 10 with VCSEL chip 11, which are provided with a cover element on the side surfaces 12, are separated.

Suitable casting materials include in particular silicones, epoxy resin and composites. The properties of the individual casting materials can also be adapted as required by adding specially selected fillers.

FIG. 5 shows a light emitter unit 10 with a bottom-emitting VCSEL—chip 11 package with metallized electrical contacts 17. The light emitter unit 10 shown in FIG. 3 essentially has a VCSEL chip 11, on the bottom side of which the contacts provided for supplying the VCSEL chip 11 with the required electrical energy are arranged.

In the embodiment example shown in FIG. 3, light is emitted into the environment 16 in an upward direction. The designation bottom-emitting VCSEL chip 11 is due to the manufacturing process, which is explained in more detail below, in which the VCSEL chip 11 is first manufactured and contacted in an inverted position and is only rotated after the manufacturing process and separation have been completed.

The electrical contacts 17 of the figure shown in FIG. 3 light emitter unit 10 are made by applying a metallization that extends the electrodes 22 of the VCSEL chip to the outer surface.

FIG. 6 shows the process for manufacturing a light emitter unit with a bottom-emitting VCSEL chip 11 package with metallized electrical contacts 17. In a first step, a VCSEL chip 11 is applied to a temporary carrier 20, with the light-emitting surface facing downwards, i.e. coming to rest on the temporary carrier 20.

On the upper side and thus exposed are the contacts 22 of the VCSEL chip. A polymer film or a ceramic is preferably used as the temporary carrier 20. An essential property of the material used for the temporary carrier 20 is that it can be easily separated from the light emitter unit 10 after completion of the manufacture of the light emitter unit 10 without damaging the light emitter 10.

In a next step, the VCSEL chip lying upside down on the temporary carrier 20 is potted with a potting material, for example silicone, epoxy resin, composites, in particular silicone with filler, and thus a cover element 12 enclosing the side face 18 is produced. It is important here that the side surfaces of the VCSEL chip 11 are tightly encapsulated and that creep of the encapsulation material is prevented during operation of the VCSEL chip 11, in particular due to the increased operating temperature. The generation of the cover element 12 also provided according to this embodiment can be carried out with the aid of a potting material, as previously described.

Preferably, the cover element 12 according to this embodiment example is produced by compression molding. In this process, epoxy resin in tablet form (Epoxy Molding Compound—EMC) is not transferred into a cavity via pistons, but is metered directly into the cavity as a paste or granules, in particular scattered. The epoxy resin is heated to temperatures between 120 and 175° C., the light emitter unit with the VCSEL chip is pressed into the cavity and then pressed under an internal mold pressure of about 20 bar. Air inclusions can be avoided by additionally working in a vacuum. Comparatively large areas can be encapsulated with the aid of compression molding.

In the next process step, the contacts 22 of the VCSEL chip 11 are extended to the outer surface. Preferably, a metallization is applied for this purpose so that sufficiently large contacts 17 are provided on the outside, here on the surface, of the VCSEL chip 11.

In the next step, the temporary carrier 20 is removed, preferably with the aid of chemical processes or laser ablation. In the final process step, the now encapsulated light emitter unit 10, which has a VCSEL chip 11 as well as a contact 17, is separated and turned over. In this representation, the light emitting surface 15 intended for light emission is now again located on the upper side, while the contacts 17 are located on the lower side.

In addition, it is advantageous to apply additional elements as required with the light emitter 10 shown by means of further process steps. In this context, it is conceivable, for example, to apply optical elements 13, such as a diffractive optical element or a microlens, to the light emission surface 15 located on the upper side.

Common to all previously explained embodiments is that a light emitter unit 10 with a VCSEL chip 11 is provided, which has a cover element 12 that has been produced by molding or with a suitable injection molding process, such as film-assisted transfer molding or compression molding. The illustrated light emitter units 10 with VCSEL chip have a relatively small size compared to known technical solutions, in particular the height of the components is particularly small. For this reason, the light emitter units shown can be advantageously integrated alone or in the form of arrays into corresponding devices, for example for distance measurement or object detection.

The invention claimed is:

1. A light emitter unit comprising at least one VCSEL chip, which has a light emission surface via which light generated by the VCSEL chip and emitted perpendicular to the chip plane is emitted into an environment, and which has contacts for supplying an electrical energy required for the generation of the light by the VCSEL chip,
   wherein the light emitter unit does not comprise a fixed substrate as well as a rigid housing,
   wherein the contacts for supplying the electrical energy required for the generation of the light by the VCSEL chip are located on an underside of the light emitter unit;
   wherein at least one side surface of the VCSEL chip, which side surface is arranged perpendicular to the chip plane, is touched and covered, at least in sections, by a cover element, the cover element terminating essentially planarly with the light emission surface,
   wherein an upper surface of the cover element facing away from the contacts of the VCSEL chip is at least partially laterally adjacent to and essentially flush with an upper surface of the light emission surface, and
   wherein the light emission surface of the VCSEL chip is uncovered by material of the cover element.

2. The light emitter unit according to claim 1, wherein the cover member has at least one material selected from a group of materials comprising silicone, epoxy resin and composite material.

3. The light emitter unit according to claim 2, wherein the material comprises at least one filler.

4. The light emitter unit according to claim 3, wherein the filler comprises silicon dioxide (SiO2).

5. The light emitter unit according to claim 1, wherein the VCSEL chip is arranged on an integrated circuit.

6. The light emitter unit according to claim 1, wherein the light emitting surface is part of the VCSEL chip.

7. The light emitter unit according to claim 1, wherein the light emission surface is at least partially formed by an optical element.

8. The light emitter unit according to claim 7, wherein the optical element comprises at least one diffractive optical element, a meta-optic and/or a lens.

9. The light emitter unit according to claim 7, wherein the optical element has a transparent window.

10. The light emitter unit according to claim 1, wherein an optical spacer is arranged between the VCSEL chip and the light emission surface.

11. The light emitter unit according to claim 1, wherein at least one detector and/or sensor is provided.

12. The light emitter unit according to claim 1, wherein the VCSEL chip comprises at least one integrated circuit.

13. The light emitter unit according to claim 1, wherein the cover element is produced by film-assisted transfer molding (FAM), compression molding and/or transfer molding.

14. The light emitter unit according to claim 1, wherein the cover element comprises a cured potting compound.

15. The light emitter unit according to claim 1, wherein the VCSEL chip is connected to the contacts by means of a flip-chip assembly.

\* \* \* \* \*